(12) United States Patent
Kiselev et al.

(10) Patent No.: US 9,009,016 B2
(45) Date of Patent: Apr. 14, 2015

(54) NMR MEASUREMENT OF CONTRAST MEDIUM CONCENTRATIONS

(71) Applicant: Universitaetsklinikum Freiburg, Freiburg (DE)

(72) Inventors: Valerij Kiselev, Freiburg (DE); Elias Kellner, Frieburg (DE)

(73) Assignee: Universitaetsklinikum Freiburg, Freiburg (DE)

( * ) Notice: Subject to any disclaimer, the term of this patent is extended or adjusted under 35 U.S.C. 154(b) by 361 days.

(21) Appl. No.: 13/651,506

(22) Filed: Oct. 15, 2012

(65) Prior Publication Data
US 2013/0102884 A1    Apr. 25, 2013

(30) Foreign Application Priority Data

Oct. 20, 2011   (DE) .......................... 10 2011 084 867

(51) Int. Cl.
*G06G 7/48* (2006.01)
*G01R 33/563* (2006.01)
*G01R 33/48* (2006.01)
*G01R 33/56* (2006.01)

(52) U.S. Cl.
CPC ...... *G01R 33/56366* (2013.01); *G01R 33/4824* (2013.01); *G01R 33/5601* (2013.01)

(58) Field of Classification Search
USPC ................. 703/6, 11; 600/419, 426; 382/131; 424/9.3
See application file for complete search history.

(56) References Cited

U.S. PATENT DOCUMENTS

| | | | |
|---|---|---|---|
| 5,186,924 A * | 2/1993 | Fishman | 424/9.3 |
| 5,320,099 A | 6/1994 | Roberts | |
| 6,389,304 B1 | 5/2002 | Van Den Brink | |
| 6,546,275 B2 | 4/2003 | Carroll | |
| 7,283,862 B1 | 10/2007 | Slavin | |
| 2003/0166999 A1 | 9/2003 | Liu | |
| 2005/0058331 A1* | 3/2005 | Klotz | 382/131 |
| 2008/0262344 A1* | 10/2008 | Brummett | 600/426 |

(Continued)

FOREIGN PATENT DOCUMENTS

EP    1 171 028    11/2005

OTHER PUBLICATIONS

Van Osch, Matthias J.P. et al., "Measuring the Arterial Input Function With Gradient Echo Sequences", Magnetic Resonance in Medicine 49:1067-1076 (2003).

(Continued)

*Primary Examiner* — Kandasamy Thangavelu
(74) *Attorney, Agent, or Firm* — Paul Vincent

(57) ABSTRACT

A method for measuring the cerebral perfusion of a living organism (1) by means of magnetic resonance (="MR") imaging proposes acquisition of further MR signals in a slice (5) that is pervaded by an artery that supplies the blood to the brain in order to determine the temporal progression of the concentration of the contrast medium during the bolus passage in the artery. During acquisition of the further MR signals, a magnetic field gradient is applied in such a way that projection images of the slice are generated. In each time interval between the excitations of the further MR signals, at least one radio-frequency (="RF") pulse is irradiated that causes saturation of the nuclear spin magnetization in the slice. This enables simultaneous measurement of the contrast medium flow in the vessels supplying the brain and the brain tissue within the same sequence with an adapted dynamic range.

14 Claims, 2 Drawing Sheets

(56) References Cited

U.S. PATENT DOCUMENTS

2009/0253982 A1* 10/2009 Wang .................. 600/419
2011/0044524 A1 2/2011 Wang

OTHER PUBLICATIONS

Jezzard, Peter et al., "Correction for Geometric Distortion in Echo Planar Images from $B_O$ Field Variations", MRM 34:65-73 (1995).

Mani, Sanjay et al., "Background Suppression with Multiple Inversion Recovery Nulling: Applications to Projective Angiography", MRM 37:898-905 (1997).

L. Ostergaard et al., "High Resolution Measurement of Cerebral Blood Flow using Intravascular Tracer Bolus Passages. Part I: Mathematical Approach and Statistical Analysis", Magn. Reson. Med. 36(5): 715-ff, 1996.

L. Ostergaard et al., High Resolution Measurement of Cerebral Blood Flow Using Intravascular Tracer Bolus Passages. Part II: Experimental Comparison and Preliminary Results. Magn. Reson. Med. 36(5): 726-ff, 1996.

R.D. Newbould et al., "Perfusion Mapping With Multiecho Multishot Parallel Imaging EPI", Magn. Reson. Med. 58(1): 70-81, 2007.

F. Calamante et al., "Defining a Local Arterial Input Function for Perfusion MRI Using Independent Component Analysis", Magn. Reson. Med. 52(4): 789-797, 2004.

K. Mouridsen et al., "Automatic Selection of Arterial Input Function Using Cluster Analysis", Magn. Reson. Med. 55(3):524-531, Mar. 2006.

Eugene G. Kholmovski et al., "Perfusion MRI With Radial Acquisition for Arterial Input Function Assessment", Magnetic Resonance in Medicine 57:821-827 (2007).

Dominick J.O. McIntyre et al., "A method for interleaved acquisition of a vascular input function for dynamic contrast-enhanced MRI in experimental rat tumours", NMR Biomed. 2004:17:132-143.

B.F. Kjolby et al., "Realistic Model of Partial Volume Effect on the AIF in Dynamic Susceptibility Contrast Perfusion MRI", Proc. Intl. Soc. Mag. Reson. Med. 15 (2007).

P. Gall et al., "Dynamic Perfusion Evaluation Based on a Tissue Model", Proc. Intl. Soc. Reson. Med. 15 (2007).

Johannes G. Korporaal, Phase-based Arterial Input Function Measurements in the Femoral Arteries for Quantification of Dynamic Contrast-enhanced (DCE) MRI and Comparison With DCE-CT. Magnetic Resonance in Medicine 66:1267-1274 (2011).

* cited by examiner

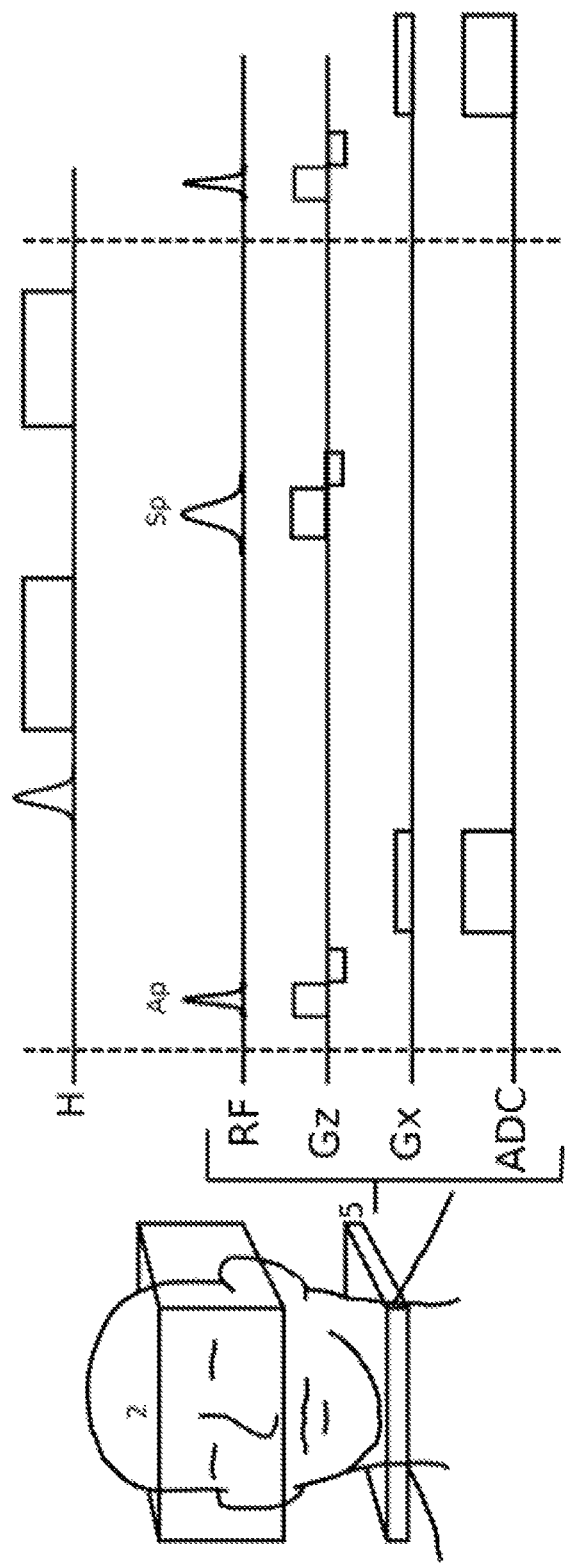

NMR MEASUREMENT OF CONTRAST MEDIUM CONCENTRATIONS

This application claims Paris convention priority of DE 10 2011 084 867.3 filed on Oct. 20, 2011 the entire disclosure of which is hereby incorporated by reference.

BACKGROUND OF THE INVENTION

The invention relates to a method for measuring the cerebral perfusion of a living organism by means of magnetic resonance (="MR") imaging, wherein the change in the MR signal is measured during the passage of a contrast medium bolus in a measurement volume in the brain of the living organism and wherein, additionally in a slice that is pervaded by an artery that supplies the blood to the brain, further MR signals are acquired to determine the temporal progression of the concentration of the contrast medium in the artery during the bolus passage.

Such a method is known from "Measuring the Arterial Input Function With Gradient Echo Sequences" by Matthias J. P. van Osch, Evert-jan P. A. Vonken, Max A. Viergever, Jeroen van der Grond, and Chris J. G. Bakker, Magnetic Resonance in Medicine, 49:1067-1076 (2003).

The object of a dynamic susceptibility contrast (=DSC) measurement is to determine perfusion parameters, such as cerebral blood volume (=CBV), cerebral blood flow (=CBF), and mean transit time (=MTT) with local resolution. If a contrast medium bolus is injected into the arm vein, the passage of this bolus through the brain will produce a time-variable contrast in the magnetic resonance (=MR) image. Fast MR sequences (e.g. echo planar imaging (=EPI)), enable temporally and spatially resolved measurement of the passage of this contrast medium bolus. The change in the relaxation rate can be determined for each voxel from the time series measured in this way. The contrast medium concentration can be approximately determined from the change in the relaxation rate.

The above parameters are determined using the tracer kinetic model [1, 2, 3]. This model establishes a connection between the progression of the contrast medium concentration in the arterial supply ($c_{in}$ (t)) and the progression of the contrast medium concentration in the voxel under consideration ($c_t$ (t)). The above parameters can be determined by comparing the two progressions.

The signal change caused by the contrast medium is very different in the tissue and in the arteries. The dynamic range of the measurement is so limited that the arteries and tissue cannot be optimally measured with the same echo time (=TE). With a short TE, it is possible to measure the change in relaxation rate in large vessels, while in tissue, where the CBV is small, the effect of the contrast medium is no longer visible. With a long TE, the effect in the tissue is easily visible but the magnetization in large vessels is then almost completely relaxed and therefore does not produce a signal above the noise level. A very short echo time would enable measurement of the arterial blood but is very complex to image and has so far not been implemented. In a standard protocol, a TE is selected that is optimized for tissue. There are approaches in which multiple echoes of the same excitation [4,6] are acquired, but it has been shown that the shortest echo time is still too long to measure the arterial signal.

The fast MR sequences required for perfusion measurements, such as EPI, suffer from an artifact in which the inhomogeneities of the main magnet field result in a disturbance of the spatial encoding due to the associated changes in local Larmor frequency. This is manifested as an artificial shift of image elements [10]. Such inhomogeneities arise locally in the vicinity of blood vessels due to the contrast medium. This is manifested as an apparent movement of arteries through the image during the bolus passage.

The tracer kinetic model requires that $C_{in}$ be the direct input of the voxel under consideration. As explained above, the arterial input function (=AIF) is determined further away in the vessel tree by way of a substitute. In this additional way, the shape and arrival time of the bolus is changed due to the blood flow conditions. To minimize these effects, it was suggested that an individual AIF be determined for a given brain area instead of a global AIF [5]. Given the relatively low spatial resolution, this is associated with such local AIFs in arteries being determined as very small compared with the voxel size. This so-called partial volume effect results in a severe loss of the arterial contribution in the measured signal.

To minimize partial volume effects, van Osch et al. have proposed in [6] that the complex-value signal be recorded during DSC measurement. If a vessel is chosen that is parallel to the magnetic field, it is possible to separate the contribution of the large vessel from that of the surrounding tissue. However, such a vessel is hard to find. Straight blood vessels that can be used as local AIF are generally not parallel to the magnetic field and are thus not suitable for correction. Large vessels, such as the internal carotid are almost parallel to the magnetic field but the high contrast medium concentration per voxel exceeds the dynamic range of a typical measurement.

The currently most frequently used method of DSC evaluation is based on selection of a global AIF. Selection can be performed manually if the user chooses a voxel whose signal the user considers to be a suitable AIF.

It has been shown that the resulting perfusion parameters heavily depend on the user. To obtain comparable and reproducible results, methods of automatic AIF selection have been suggested [7, 8, 9]. Just like manual selection, an AIF is obtained that is distorted by partial volume effects and apparent movement.

In patent EP 0 958 503 B1, it is suggested that AIF be measured in the neck of the patient. This is done by exciting a one-dimensional volume, e.g. a cylinder that contains the carotids. The selective excitation pulses that this requires are very long, which is why the measurement of the blood signal becomes too inaccurate for high contrast medium concentrations because the TE is too long. Shortening the pulse lengths, although conceivable, would worsen the selection profile, which would result in partial volume problems. Moreover, this solution does not provide a way of handling the artificial shift of the arteries caused by the contrast medium.

Van Osch et al. proposed a further solution and placed an excitation slice through the neck, which was pervaded by the arteries. For each slice, during the brain measurement, van Osch et al. attempted to determine the AIF with a short echo time. A complete 2-D acquisition was made of the neck slice. During the passage of the contrast medium bolus, however, the signal almost completely dropped below the noise level. Moreover, several excitations of the neck slice were required in the brain for each slice because of the short echo time.

The problems with the prior art described above can be summarized as follows:
Very different concentrations of the contrast medium in large vessels and tissue make accurate and simultaneous measurement of large vessels and tissue with the same sequence parameters impossible.
For perfusion measurement, the sequence parameters must be optimized for the tissue contrast. That results in the arterial signal dropping below the noise level.

Arterial input functions that can be determined with the means of the prior art can be distorted by partial volume effects.

The change in the Larmor frequency due to the contrast medium results in a shift in the position of the arteries in the acquired image.

The temporal resolution of the DSC measurement is very low, especially for the AIF.

The object of this invention is therefore to provide a method that enables simultaneous measurement of the contrast medium flow in vessels supplying the brain and brain tissue within the same sequence with an adapted dynamic range.

SUMMARY OF THE INVENTION

This object is inventively achieved in a surprisingly simple but effective manner in that 2-dimensional imaging of the slice is dispensed with during acquisition of the further MR signals from the slice and, instead, a magnetic field gradient is applied in such a way that the projection images of the slice are generated and that, in each time interval between the excitations of the further MR signals, at least one radio-frequency ("RF") pulse is irradiated that causes saturation of the nuclear spin magnetization in the slice.

To determine the AIF, a slice is excited in the neck through which the carotids of interest extend as perpendicularly as possible and one-dimensional imaging thereof is performed, that means, that the entire slice is projected onto a line that connects the two carotids. This projection is performed using a read gradient. The signal of the stationary tissue is saturated to strengthen the blood signal relatively to the tissue signal by the inflow effect. The inflow effect results from the tissue being saturated and hardly any signals still being generated while the vessels bearing the blood are still producing signals due the inflow of fresh, unsaturated blood. This technique is known from other applications, such as angiography [11], but has not previously been applied to AIF determination. The inflow effect results in a clear contrast improvement of the blood-bearing vessels in relation to the surrounding tissue.

In terms of time, the neck slice is measured between each measurement of a slice in the brain, which results in a fast repetition time of the measurement in the neck slice of up to 100 ms. With methods according to the prior art, a neck slice is measured once per brain volume (i.e. approx. each 1.2 s to 1.8 s).

The inventive method has clear advantages over the state of the art which, for the first time, permit quantitative determination of the contrast medium concentration in the arteries:

By this technical implementation, measurement can be performed in the neck slice with the short echo time adapted for the blood signal (up to 0.6 ms). This keeps the blood signal clearly above the noise level for all contrast medium concentrations.

By combining projection imaging and saturation, a spatially highly resolved image (e.g. 0.8 mm per pixel) of the arteries is obtained.

The positive effect of this combination was described by Nishimura et al. [11], but is used for the first time for measuring AIF as part of the inventive method.

The inventive method precisely determines the background signal originating from the tissue even if this signal changes due to the contrast medium.

The arteries are recognized by their pulsatile signal due to the heart beat. This permits automatic data processing in practical applications.

The inventive method is directly clinically applicable.

The inventive method solves a problem with the measurement of cerebral perfusion which has remained unsolved despite extensive activity in this field of research for the past 13 years.

A variant of the inventive method is preferred in which the artificial position shift of the artery position in the projection of the images of the slice compared with the actual position of the artery which is caused by a change in the Larmor frequency of the proton spins in the blood caused by the contrast medium is used for, preferably quantitative, determination of the concentration of the contrast medium during the bolus passage in the artery. This method for determining the contrast medium concentration has the advantage that, thanks to the inventive method, the arteries can be represented well resolved and in this way the linear relationship between the shift and the contrast medium concentration can be exploited for uncomplicated and precise determination of the contrast medium concentration. This requires a high spatial resolution of the arteries with a good contrast-to-noise ratio, which is achieved by the inventive method.

As an alternative or in combination, a further variant is advantageous in which the change in the amplitudes and/or phases of the further MR signals caused by a change in the relaxation times of the proton spins in the blood due to the contrast medium is used for, preferably quantitative, determination of the concentration of the contrast medium during the bolus passage in the artery. In the case of not entirely adequate spatial resolution of the arteries, this variant can be used additionally or alone to determine the contrast medium concentration.

Therein it is advantageous if the saturation of the nuclear spin magnetization in the slice is caused by irradiation of an inversion pulse in such a way that the nuclear spin magnetization in the slice is located at the passage through zero on the next following excitation of further MR signals.

A variant of the inventive method is also preferred in which the saturation of the nuclear spin magnetization in the slice is achieved by irradiation of one or more RF pulses briefly (e.g. 40 ms) before excitation of the further MR signals, in particular, several RF pulses occurring in quick temporal succession that rotate the nuclear spins about a small flip angle. This can result in faster repetition times as compared with the previous methods.

A further variant of the inventive method is characterized in that after each excitation and before each acquisition of the further MR signals, a magnetic field gradient is applied that dephases the nuclear spin magnetization in the slice, by which the signal of the background tissue can be further suppressed.

A variant of the inventive method is especially preferred in which the further MR signals from the slice are acquired with a repetition time TR<200 ms, preferably TR=100 ms. This enables measurement of the cardiac cycle with temporal resolution. In this way, possible influences of the pulsatility of the blood flow on the further MR signals can be taken into consideration.

A variant of the inventive method is also advantageous that is characterized in that the further MR signals from the slice (5) are acquired with a gradient echo time TE<4 ms. This keeps the blood signal clearly above the noise level for all contrast medium concentrations.

A further variant of the inventive method is characterized in that the change in the MR signal during the passage of the contrast medium bolus is determined in the brain both with a gradient echo and with a spin echo wherein the spin echo is caused by refocusing the nuclear spin excited to generate the gradient echo. This characteristic can improve the precision of the perfusion quantification as compared with the previous method.

The scope of the invention also includes a tomography device for performing the inventive method with a first MR coil system for acquiring a spatially resolved time series of MR images in a measurement volume in the brain of a living organism, wherein the time series of MR images represents the passage through the brain of contrast medium injected into the living organism, characterized in that at least one further MR coil system is provided which comprises a local acquisition coil that, in a slice that is pervaded by an artery supplying the brain with blood, measures further MR signals for determining the temporal progression of the concentration of the contrast medium during the bolus passage in the artery with temporal resolution and simultaneously with measurement of the temporal series of MR images determined by the first MR coil system.

An embodiment of this device is characterized in that the further MR coil system comprises a surface coil. In this way, the signal-to-noise ratio can be further improved.

Further advantages of the invention can be derived from the description and the drawings. The characteristics stated above and below can also be used singly or in any combination according to the invention. The embodiments shown and described are not an exhaustive list but are examples to explain the invention.

The invention is shown in the drawing and is explained in more detail using examples.

BRIEF DESCRIPTION OF THE DRAWING

FIG. 2 a sequence diagram of an example for an inventive method.

DESCRIPTION OF THE PREFERRED EMBODIMENT

Figure 1:
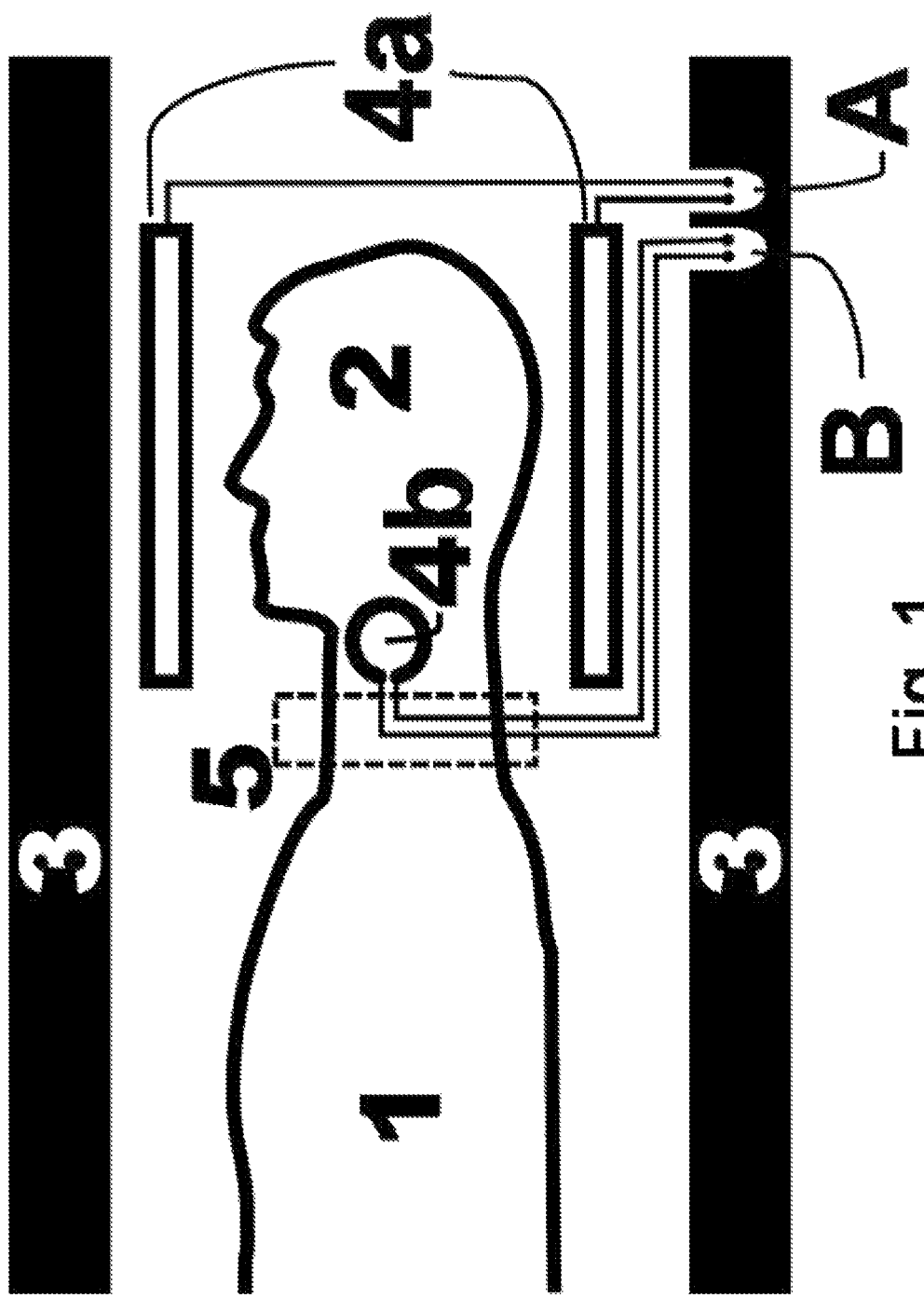
FIG. 1 an exemplary, schematic representation of a tomography for performing the inventive method.

In the schematic representation FIG. 1, a brain 2 of a living organism 1 to be examined (in this case, a person) in which the measurement volume of the tomography device 3 defined by the first MR coil system 4a is positioned. The further MR coil system 4b comprising a surface coil, for example, is applied to the neck of the patient. The magnetization from the excitation slice 5 is used as a signal source for the further MR coil system 4b.

The sequence diagram FIG. 2 shows, by way of example, a possible sequence in measurement in the brain 2. Further sequences occur at the same time as the sequence G in the brain, in the slice 5, into which the contrast medium concentration is to be determined.

The high-frequency sequence RF shows the application of an excitation pulse Ap and a saturation pulse Sp according to the invention.

The slice selection sequence Gz represents application of a slice selection gradient that permits generation of a projection image in the slice.

The read sequence Gx shows application of a read gradient.

The read-out sequence ADC shows the temporal progression of data read-out.

LIST OF REFERENCE SYMBOLS

1 Living organism to be examined
2 Brain
3 Tomography device
4a First MR coil system (tissue)
4b Further MR coil system (contrast medium/blood)
5 Excited slice
A Data channel of first MR coil system
B Data channel of further MR coil system
H Brain sequence
RF Radio-frequency sequence in the slice
Gz Slice selection gradient sequence
Gx Read-out gradient sequence
ADC Read-out sequence
Ap Excitation pulse
Sp Saturation pulse

REFERENCES

[1] L. Ostergaard, R. Weisskoff, D. Chesler, C. Gyldensted, and B. Rosen: High resolution measurement of cerebral blood flow using intravascular tracer bolus passages. Part I: Mathematical approach and statistical analysis. Magn Reson Med, 36(5):715-25, 1996.

[2] L. Ostergaard, A. Sorensen, K. Kwong, R. Weisskoff, C. Gyldensted, and B. Rosen: High resolution measurement of cerebral blood flow using intravascular tracer bolus passages. Part II: Experimental comparison and preliminary results. Magn Reson Med, 36(5):715-25, 1996.

[3] L. Ostergaard: Patent DE000060024073T2: System for determining haemodynamic indices by use of tomographic data.

[4] R. Newbould, S. Skare, T. Jochimsen, M. Alley, M. Moseley, O. Albers, R. Bammer: Perfusion mapping with multiecho multishot parallel imaging EPI. Magn Reson Med, 58(1):70-81, 2007

[5] F. Calamante, M. Morup, L. Hansen: Defining a local arterial input function for perfusion MRI using independent component analysis. Magn Reson Med, 52(4):789-797, 2004

[6] M. van Osch, E. Vonken, M. Viergever, J. van der Grond, and C. Bakker: Measuring the arterial input function with gradient echo sequences. Magn Reson Med., 49:1067-76, 2003.

[7] T. J. Carroll, H. A. Rowley, and V. M. Haughton: Automatic calculation of the arterial input function for cerebral perfusion imaging with mr imaging. Radiology, 227(2): 593-600, May 2003.

[8] T. J. Carroll: U.S. Pat. No. 6,546,275: Determination of the arterial input function in dynamic contrast-enhanced MRI

[9] K. Mouridsen, S. Christensen, L. Gyldensted, and L. Ostergaard: Automatic selection of arterial input function using cluster analysis. Magn Reson Med, 55(3):524-531, March 2006.

[10] P Jezzard, and R. S. Balaban: Correction for geometric distortion in echo planar images from $B_0$ field variations Magn Reson Med, 34(1) 65-73 July 1995.

[11] Sanjay Mani, John Pauly, Steven Conolly, Craig Meyer, Dwight Nishimura: Background Suppression with Multiple Inversion Recovery Nulling: Applications to Projective Angiography, MRM 37:898-905, 1997

We claim:

1. A method for measuring the cerebral perfusion in a brain of a living organism by means of magnetic resonance (="MR") imaging, the method comprising the steps of:
   a) measuring a change in an MR signal during passage of a contrast medium bolus in a measurement volume in the brain of the living organism;
   b) acquiring, in a slice that is pervaded by an artery that supplies blood to the brain, further MR signals to determine a temporal progression of a concentration of the contrast medium during the bolus passage in the artery;
   c) applying, during step b), a magnetic field gradient in such a way that projection images of the slice are generated; and
   d) irradiating, in each time interval between excitations of the further MR signals, at least one radio-frequency (="RF") pulse that causes saturation of nuclear spin magnetization in the slice.

2. The method of claim 1, wherein an artificial position shift of an artery position in a projection of images of the slice compared with an actual position of the artery, which is caused by a change in a Larmor frequency of proton spins in the blood due to the contrast medium, is used for determination of the concentration of the contrast medium during bolus passage in the artery.

3. The method of claim 2, wherein the determination of the concentration of the contrast medium is quantitative.

4. The method of claim 1, wherein a change in amplitudes and/or phases of the further MR signals, which is caused by a change in relaxation times of proton spins in the blood due to the contrast medium, is used for determination of the concentration of the contrast medium during the bolus passage in the artery.

5. The method of claim 4, wherein the determination of the concentration of the contrast medium is quantitative.

6. The method of claim 1, wherein a saturation of nuclear spin magnetization in the slice is caused by irradiation of an inversion pulse in such a way that nuclear spin magnetization in the slice is located at a passage through zero on a next following excitation of further MR signals.

7. The method of claim 1, wherein a saturation of nuclear spin magnetization in the slice is caused by irradiation of one or more RF pulses shortly prior to excitation of the further MR signals.

8. The method of claim 1, wherein a magnetic field gradient is applied after each excitation and before each acquisition of the further MR signals which dephases nuclear spin magnetization of the slice.

9. The method of claim 1, wherein the further MR signals from the slice are acquired with a repetition time TR<200 ms.

10. The method of claim 9, wherein TR=100 ms.

11. The method of claim 1, wherein the further MR signals from the slice are acquired with a gradient echo time TE<4 ms.

12. The method of claim 1, wherein a change in the MR signal during passage of the contrast medium bolus is determined in the brain both with a gradient echo and with a spin echo, wherein the spin echo is caused by refocusing nuclear spins excited to generate the gradient echo.

13. A tomography device structured for performing the method of claim 1, the device comprising:
   a first MR coil system for acquiring a spatially resolved time series of MR images in a measurement volume in the brain of the living organism, wherein the time series of MR images represents passage through the brain of contrast medium injected into the living organism; and
   at least one further MR coil system which comprises a local acquisition coil that, in a slice that is pervaded by an artery supplying the brain with blood, measures further MR signals for determining the temporal progression of the concentration of the contrast medium during the bolus passage in the artery with temporal resolution and simultaneously with measurement of the temporal series of MR images determined by the first MR coil system.

14. The tomography device of claim 13, wherein the further MR coil system comprises a surface coil.

* * * * *